United States Patent
Lachartre

(10) Patent No.: US 11,177,994 B2
(45) Date of Patent: Nov. 16, 2021

(54) POLAR PHASE OR FREQUENCY MODULATION CIRCUIT AND METHOD

(71) Applicant: Commissariat à l'Energie Atomique et aux Energies Alternatives, Paris (FR)

(72) Inventor: David Lachartre, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/948,069

(22) Filed: Aug. 31, 2020

(65) Prior Publication Data

US 2021/0067400 A1 Mar. 4, 2021

(30) Foreign Application Priority Data

Sep. 3, 2019 (FR) ...................... 1909690

(51) Int. Cl.
| | | |
|---|---|---|
| H04L 5/12 | (2006.01) | |
| H04L 27/36 | (2006.01) | |
| H03F 1/32 | (2006.01) | |
| H03F 3/24 | (2006.01) | |
| H04B 1/04 | (2006.01) | |

(52) U.S. Cl.
CPC ......... *H04L 27/361* (2013.01); *H03F 1/3282* (2013.01); *H03F 3/24* (2013.01); *H04B 1/0483* (2013.01)

(58) Field of Classification Search
CPC ............. H03F 1/3282; H03F 2200/451; H03F 1/3247; H03F 3/24; H03F 2201/3233; H03F 2200/336; H03F 3/211; H03F 3/195; H03F 2200/387; H03F 1/0222; H03F 2200/102; H03F 1/3241; H03F 3/68; H04L 27/361; H04B 1/0483
USPC .................. 375/262, 261, 260, 259
See application file for complete search history.

(56) References Cited

U.S. PATENT DOCUMENTS

| | | | |
|---|---|---|---|
| 2005/0079835 A1 | 4/2005 | Takabayashi et al. | |
| 2007/0009062 A1 | 1/2007 | Matsuura et al. | |
| 2009/0207941 A1* | 8/2009 | Osman ................. | H03C 3/00 375/302 |
| 2013/0016982 A1* | 1/2013 | Henzler ................ | H04B 10/50 398/161 |

FOREIGN PATENT DOCUMENTS

| | | |
|---|---|---|
| WO | 2013092867 A1 | 6/2013 |
| WO | 2013092876 A1 | 6/2013 |

OTHER PUBLICATIONS

Preliminary Search Report for French Application No. 1909690 dated Jul. 2, 2020, 2 pages.
(Continued)

*Primary Examiner* — Zewdu A Kassa
(74) *Attorney, Agent, or Firm* — Moreno IP Law LLC

(57) ABSTRACT

The present disclosure relates to a polar phase or frequency modulator comprising: a normalized delay circuit (602) configured to delay edges of an input carrier signal (CLK_IN) based on normalized delay control values ($\varphi i$) to generate a modulated output signal (RF_OUT); and a normalized delay calculator (604) configured to receive the modulated output signal (RF_OUT) and to generate the normalized delay control values ($\varphi i$).

15 Claims, 12 Drawing Sheets

(56) References Cited

OTHER PUBLICATIONS

G. Divakaran et al., "Delay Based Frequency Modulation," 2005 Asia-Pacific Conf, on Comms., Oct. 3, 2005, pp. 33-37.
Y.C Choi et al., "A Fully-Digital Phase Modulator with a Highly Linear Phase Calibration Loop for Wideband Polar Transmitters," IEEE Transactions on Circuits and Systems II: Express Briefs, vol. 66, Issue 2, Feb. 2019, 5 pages.
Y.C Choi et al., "A Fully Digital Polar Transmitter Using a Digital-to-Time Converter for High Data Rate System," 2009 IEEE International Symposium on Radio-Frequency Integration Technology, Jan. 2009, pp. 56-59.
P. Madoglio et al., "A 2.4GHz WLAN Digital Polar Transmitter with Synthesized Digital-to-Time Converter in 14nm Trigate/FinFET Technology for IoT and Wearable Applications," 2017 IEEE International Solid-State Circuits Conference, Feb. 7, 2017, pp. 226-228.
A. Ravi et al., "A 2.4-GHz 20-40-MHz Channel WLAN Digital Outphasing Transmitter Utilizing a Delay-Based Wideband Phase Modulator in 32-nm CMOS," IEEE Journal of Solid-State Circuits, vol. 47, No. 12, Dec. 2012, pp. 3184-3196.
L. Ye et al., "Design Considerations for a Direct Digitally Modulated WLAN Transmitter With Integrated Phase Path and Dynamic Impedance Modulation," IEEE Journal of Solid-State Circuits, vol. 48, No. 12, Dec. 2013, pp. 3160-3177.

\* cited by examiner

POLAR PHASE OR FREQUENCY MODULATION CIRCUIT AND METHOD

FIELD

The present disclosure relates generally to the field of RF communications, and in particular to a circuit and method for performing phase and/or frequency modulation using polar modulation.

BACKGROUND

In the field of RF communications, information is generally transmitted from a transmitter to a receiver based on the modulation of a carrier frequency. Some types of modulation are based on a modification of the phase or frequency of the carrier.

There are two main techniques for performing phase modulation: polar modulation and Cartesian modulation.

Cartesian modulation is based on a projection on X and Y axes of the symbols to be transmitted. The symbols are thus represented by two quadrature values I and Q. A drawback of Cartesian modulation is that it can suffer from an error known as Error Vector Magnitude (EVM) when the number of phase symbols exceeds a certain limit.

Polar modulation involves directly modulating the phase of the carrier frequency. An advantage of polar modulation is that amplitude and phase are processed separately. This means that the modulated phase signal can be a binary logic signal in which the level of the amplitude contains no information, leading to a relatively low cost implementation.

A difficulty with polar modulation is that it can result in the generation of spurious frequencies, particularly each time the phase shift exceeds 3600 with relatively large phase shifts.

SUMMARY

There is a need in the art for a circuit and method of polar phase or frequency modulation that at least partially addresses one or more difficulties in the prior art.

According to one aspect, there is provided a polar phase or frequency modulator comprising: a normalized delay circuit configured to delay edges of an input carrier signal based on digital normalized delay control values to generate a modulated output signal; and a normalized delay calculator configured to receive at a first input the modulated output signal and having either: a second input configured to receive phase samples at a rate different to the frequency of the modulated output signal, each phase sample indicating a target phase offset of the modulated output signal with respect to the input carrier signal; or a third input configured to receive frequency samples at a rate different to the frequency of the modulated output signal, each frequency sample indicating a phase increment to be applied to the input carrier signal and corresponding to a target frequency of the modulated output signal; or the second input configured to receive the phase samples and the third input configured to receive the frequency samples, the normalized delay calculator being configured to generate the digital normalized delay control values based on the phase samples and/or frequency samples, and to supply to them to the normalized delay circuit, at a rate determined by the modulated output signal.

According to one embodiment, the normalized delay calculator is a digital circuit.

According to one embodiment, the normalized delay calculator comprises: a first digital circuit configured to generate first digital delay values calculated based on the phase samples received at the second input, the digital normalized delay control values being generated based on the first digital delay values; or a second digital circuit configured to generate second digital delay values calculated based on the frequency samples received at the third input, the digital normalized delay control values being generated based on the second digital delay values; or a first digital circuit configured to generate first digital delay values based on the phase samples received at the second input and a second digital circuit configured to generate second digital delay values based on the frequency samples received at the third input, the digital normalized delay control values being generated based on a sum of the first and second digital delay values.

According to one embodiment, the normalized delay calculator comprises the first digital circuit, which comprises: a first accumulator clocked by the modulated output signal and configured to generate the first digital delay values for applying phase modulation by summing, at a rate defined by the modulated output signal, phase increments generated based on the one or more phase samples received at an input of the normalized delay calculator.

According to one embodiment, the phase increments are provided at a frequency different to the frequency of the modulated output signal.

According to one embodiment, the polar phase or frequency modulator further comprises: a subtractor configured to determine a phase difference between each phase sample and a corresponding phase control value, wherein the phase increments are generated based on the phase differences.

According to one embodiment, the normalized delay calculator further comprises: a divider configured to divide the phase difference by N to generate the phase increments, where N is equal to at least 2.

According to one embodiment, the normalized delay calculator further comprises a register configured to store the digital normalized delay control values and to provide the digital normalized delay control values to the subtractor, wherein the register is clocked by a clock signal having a frequency equal to or less than half the frequency of the modulated output signal.

According to one embodiment, the normalized delay calculator comprises the second digital circuit, which comprises: a second accumulator clocked by the modulated output signal and having an input for receiving the frequency samples, the second accumulator being configured to generate the second digital delay values for applying frequency modulation based on the frequency samples, the second digital delay values being generated by summing, at a rate determined by the modulated output signal, the frequency samples.

According to one embodiment, the frequency samples to be modulated are each in the range:

$$FREQ'_{min} \leq FREQ' \leq FREQ'_{max} \quad [\text{Eq. 1}]$$

where:

$$FREQ'_{min} = -2^{N_f-1}+1 \quad [\text{Eq. 2}]$$

and $$FREQ'_{max} = 2^{N_f-1}-1 \quad [\text{Eq. 3}]$$

and where each frequency sample is represented by a number $N_f$ of bits.

According to one embodiment, the normalized delay calculator comprises the first and second digital circuits, the first digital circuit comprising: a first accumulator clocked by the modulated output signal and configured to generate the first digital delay values for applying phase modulation, the first delay values being generated by summing, at a rate determined by the modulated output signal, the phase increments generated based on one or more phase samples; and the second digital circuit comprising: a second accumulator clocked by the modulated output signal and configured to generate the second digital delay values for applying frequency modulation, the second digital delay values being generated by summing, at a rate determined by the modulated output signal, the frequency samples, wherein the phase increments represent a phase component of data symbols to be modulated, and the frequency samples represent modulation at a fixed intermediate frequency.

According to one embodiment, the normalized delay calculator is configured to generate the digital normalized delay control values modulo 360°.

According to one embodiment, the normalized delay circuit comprises a phase selection circuit comprising: a delay line generating a plurality of phase signals each phase-shifted by a different phase delay with respect to the input carrier signal; and a multiplexer configured to select one of the phase signals based on at least part of each digital normalized control value.

According to one embodiment, the normalized delay circuit comprises a variable delay circuit comprising: a delay line configured to propagate the input carrier signal, the delay line being selectively coupled, based on at least part of each digital normalized control value, to each of a plurality of capacitances in order to vary the capacitance of the delay line.

According to a further aspect, there is provided a method of polar phase or frequency modulation comprising: receiving a modulated output signal at a first input of a normalized delay calculator, the normalized delay calculator having a second input and/or a third input; receiving either: at the second input, phase samples at a rate different to the frequency of the modulated output signal, each phase sample indicating a target phase offset of the modulated output signal with respect to the input carrier signal; or at the third input, frequency samples at a rate different to the frequency of the modulated output signal, each frequency sample indicating a phase increment to be applied to the input carrier signal and corresponding to a target frequency of the modulated output signal; or at the second input, the phase samples and at the third input, the frequency samples, generating, by the normalized delay calculator, digital normalized delay control values based on the phase samples and/or frequency samples, and supplying them to a normalized delay circuit, at a rate determined by the modulated output signal; and delaying, by the normalized delay circuit, edges of the input carrier signal based on the digital normalized delay control values to generate the modulated output signal.

According to another aspect, there is provided a polar phase or frequency modulator comprising: a normalized delay circuit configured to delay edges of an input carrier signal based on normalized delay control values to generate a modulated output signal; and a normalized delay calculator configured to receive the modulated output signal and to generate the normalized delay control values by summing, at a rate determined by the modulated output signal, either: phase increments; or frequency samples; or phase increments and frequency samples.

According to one embodiment, the phase increments and/or frequency samples are provided at a frequency different to the frequency of the modulated output signal.

According to one embodiment, the normalized delay calculator is configured to generate the normalized delay control values modulo 360°.

According to one embodiment, the normalized delay calculator comprises: a first accumulator clocked by the modulated output signal and configured to generate first normalized delay control values for applying phase modulation by summing, at a rate defined by the modulated output signal, the phase increments generated based on one or more phase samples.

According to one embodiment, the normalized delay calculator comprises: a second accumulator clocked by the modulated output signal and configured to generate second normalized delay control values for applying frequency modulation based on the frequency samples, the second normalized delay control values being generated by summing, at a rate determined by the modulated output signal, the frequency samples.

According to one embodiment, the normalized delay calculator comprises: a first accumulator clocked by the modulated output signal and configured to generate first normalized delay control values for applying phase modulation, the first normalized delay control values being generated by summing, at a rate determined by the modulated output signal, the phase increments generated based on one or more phase samples; and a second accumulator clocked by the modulated output signal and configured to generate second normalized delay control values for applying frequency modulation, the second normalized delay control values being generated by summing, at a rate determined by the modulated output signal, the frequency samples.

According to one embodiment, the polar phase or frequency modulator further comprises an adder configured to add the first and second normalized delay control values to generate the normalized delay control values.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

The expressions "around", "approximately", "substantially" and "in the order of" signify within 10%, and preferably within 5%, unless specified otherwise.

Figure 1:
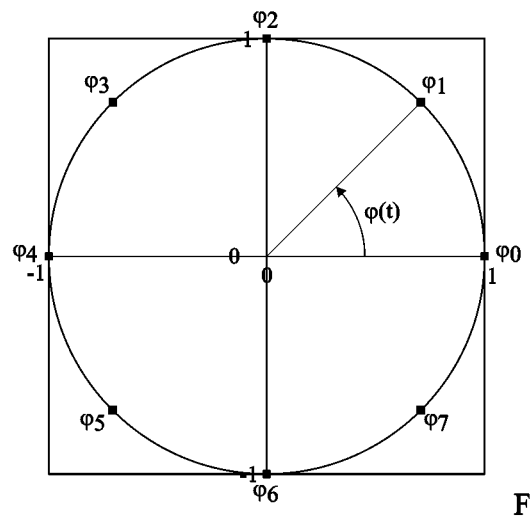
FIG. 1 is a unit circle representing an example of symbols.

FIG. 1 is a unit circle representing an example of symbols according to a phase modulation scheme. In the example of FIG. 1, there are eight symbols $\varphi_0$ to $\varphi_7$ that correspond respectively to phase shifts of 0°, 45°, 90°, 135°, 180°, 225°, 270° and 315°.

According to phase modulation, symbols are encoded by absolute phases of the carrier clock. Frequency modulation is similar to phase modulation, except that symbols are encoded by phase variations instead of fixed phases. The phase variations determine the effective frequency of the modulated signal.

Figure 2:
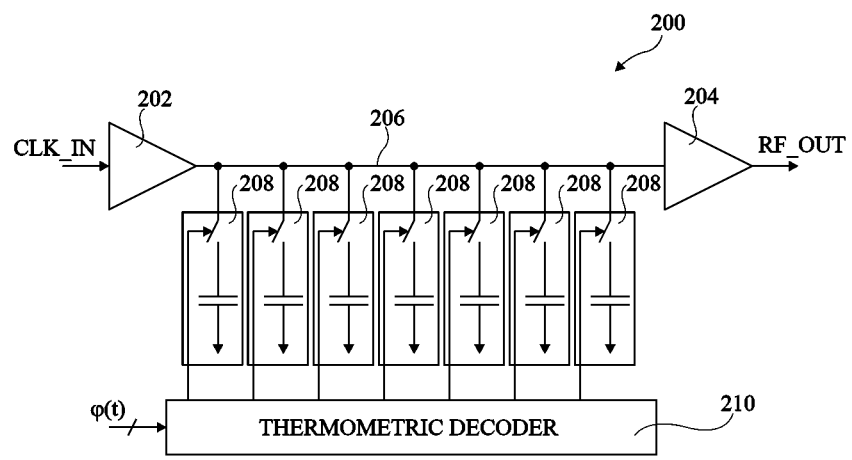
FIG. 2 schematically illustrates a polar phase modulator based on variable delay.

FIG. 2 schematically illustrates a polar phase modulator 200 based on variable delay. The modulator 200 comprises a buffer 202 receiving a clock signal CLK_IN corresponding to a carrier frequency. An output of the buffer 202 is coupled to a further buffer 204 via a delay line 206. The further buffer 204 provides the modulated output signal RF_OUT.

The capacitance of the delay line 206 coupling the buffers 202 and 204 is varied in order to modify the delay and consequently the phase of the carrier CLK_IN according to the symbols to be encoded, indicated by a digital phase control signal $\varphi(t)$. For example, a number of capacitive circuits 208 are coupled to the delay line 206, and can be selectively activated to vary the capacitance of the delay line 206. Each capacitive circuit 208 comprises for example a capacitor having one of its terminals coupled to a ground rail and its other terminal coupled to the delay line 206 via a switch. The switches of the circuits 208 are for example controlled by a thermometric decoder (THERMOMETRIC DECODER) 210 based on the phase control signal $\varphi(t)$ to be encoded. For example, the phase control signal $\varphi(t)$ is a 3-bit signal, and the decoder 210 converts this signal into a 7-bit thermometric code, where the values 0 to 7 of the 3-bit signal are respectively converted to an activation of between 0 and all 7 of the control signals to the circuits 208.

Figure 3:
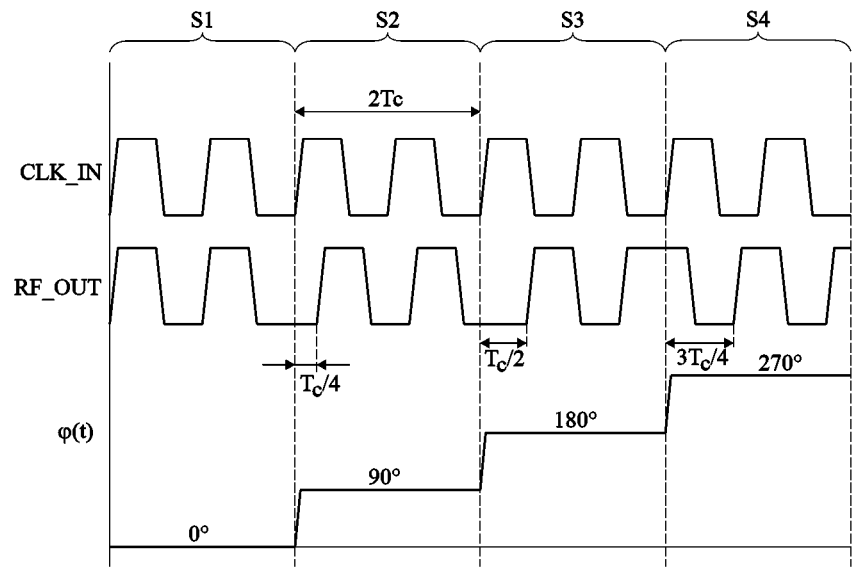
FIG. 3 is a timing diagram representing polar phase modulation of a carrier frequency.

FIG. 3 is a timing diagram representing an example of polar phase modulation using the modulator of FIG. 2, and illustrates in particular examples of the carrier frequency CLK_IN, the modulated output signal RF_OUT, and the phase control signal $\varphi(t)$.

In the example of FIG. 3, the carrier frequency CLK_IN is at a frequency Fe that is twice the symbol frequency Fsy. A series of symbols S1, S2, S3 and S4 are transmitted in the example of FIG. 4, corresponding respectively to phases of 0°, 90°, 180° and 270°. The signal RF_OUT for the symbol S1 at the phase 0° corresponds to the least delayed version of the carrier frequency CLK_IN. The signal RF_OUT for the symbol S2 at the phase 90° corresponds to the carrier frequency CLK_IN delayed by a delay $T_c/4$, where $T_c$ is the period of the carrier frequency. The signal RF_OUT for the symbol S3 at the phase 180° corresponds to the carrier frequency CLK_IN delayed by a delay $T_c/2$, and the signal RF_OUT for the symbol S4 at the phase 270° corresponds to the carrier frequency CLK_IN delayed by a delay $3T_c/4$.

Thus the delay $T_r$ applied to the carrier frequency as a function of the phase control signal $\varphi(t)$ is supposed to be linear, and for example determined by the expression:

$$T_r = \varphi(t)/(2\pi \cdot Fc) \qquad [\text{Eq. 4}]$$

In the example of FIG. 3, each symbol is applied during the symbol time $T_{sy}$ of each symbol. However, this implies abrupt phase variations at the boundary between symbols without any smooth phase transition. The frequency of a signal being a function of the differential of its phase variation, a rapid phase variation will result in high frequencies, which may exceed the limits of the transmission channel. Therefore, in practice, the symbol time $T_{sy}$ is divided into several phase samples at a sample frequency $F_s$, which is usually a multiple of the symbol frequency $F_{sy}$.

A further difficulty is that, when a phase sample changes, the effective phase does not apply until the next clock edge of the carrier frequency. Thus, the sampling period at which a phase sample is effectively applied is $T_s' = T_s + \sigma$, where $\sigma$ represents a jitter, which is a form of noise. To limit this noise in a digital polar modulator, the frequencies $F_s$ and $F_c$ are generally chosen to have a determined relation, i.e. they are synchronous, for example such that $F_s = F_c$.

Figure 4:
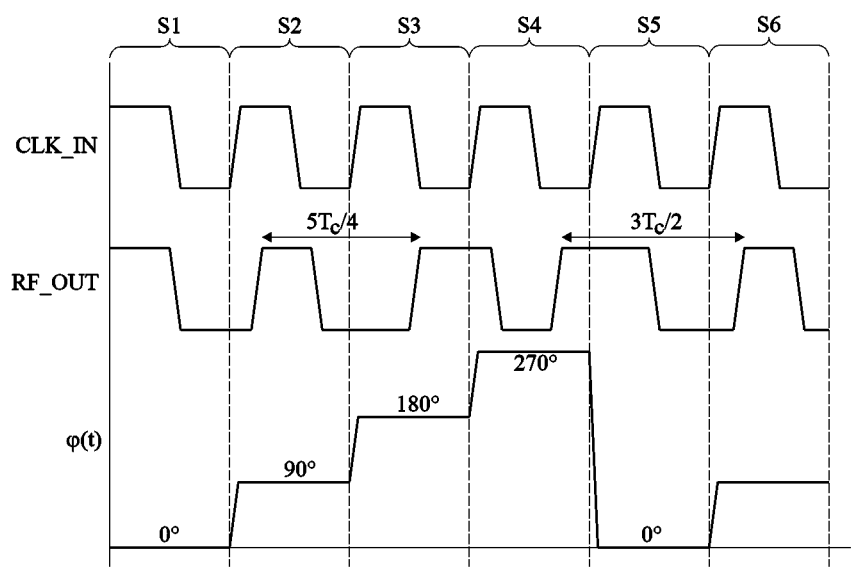
FIG. 4 is a timing diagram representing a problem of frequency error in a phase modulated signal.

FIG. 4 is a timing diagram representing an example of digital polar phase modulation using the circuit of FIG. 2 in which $F_s=F_c$, and illustrates an error in the modulation, described in more detail below. A series of phase samples S1, S2, S3, S4, S5 and S6, corresponding respectively to phases of 0°, 90°, 180°, 270°, 0° and 90°, are transmitted during corresponding periods of the carrier frequency CLK_IN. For each sample S2 to S4, the rising edge of the carrier frequency is progressively delayed, and in the sample period S5, corresponding to 0° phase, there is no rising edge. Indeed, the phase is applied modulo 360° with a return to zero, leading to a period of the signal RF_OUT effectively disappearing. It can be seen that there is a time spacing of $4T_c$ between the rising edge of the symbol S2 and the rising edge of the symbol S6 four samples later, but there is an uneven distribution of these edges in time. Indeed, the periods of the modulated signal RF_OUT between the samples S2 and S3, and between the samples S3 and S4, are each equal to $5T_c/4$, leaving a period of $4T_c-2(5T_c/4)=3T_c/4$ between the samples S4 and S5. This problem is caused by the sampling error of the phase, as will now be explained in more detail with reference to FIG. 5.

Figure 5:
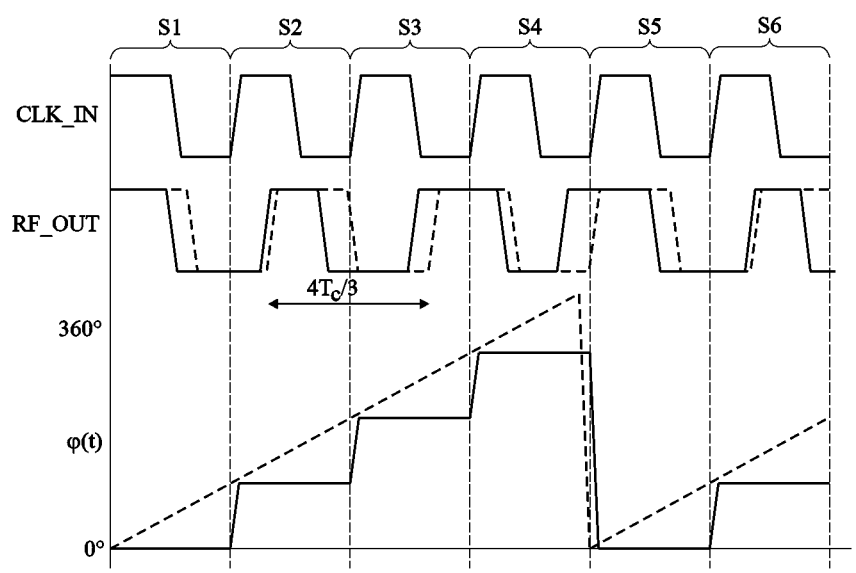
FIG. 5 is a timing diagram representing error due to phase sampling.

FIG. 5 is a timing diagram illustrating a sampling error in the signals of FIG. 4. In particular, FIG. 5 illustrates, using dashed lines, an ideal phase modulation implemented in a continuous fashion without sampling. It can be seen that the phase error of the edges of the modulated signal RF_OUT increases progressively for each sample as the phase goes from 0 to 360°. It can also be seen that each period of the modulated signal is equal to the desired average period of $4T_c/3$.

Figure 6:
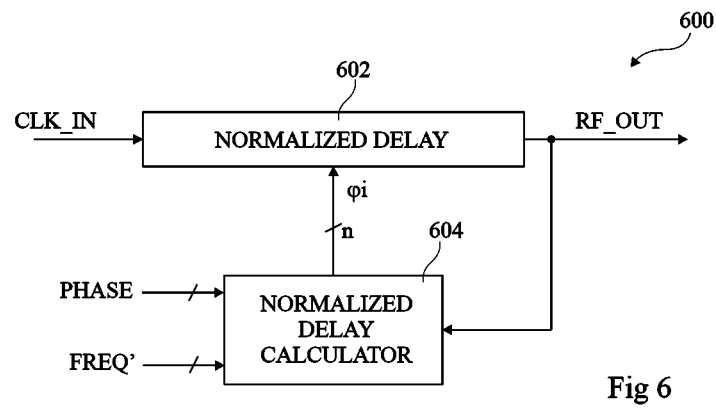
FIG. 6 schematically illustrates a polar phase and/or frequency modulator according to an example embodiment of the present disclosure.

FIG. 6 schematically illustrates a digital polar phase and/or frequency modulator 600 according to an example embodiment of the present disclosure.

The modulator 600 comprises a normalized delay circuit (NORMALIZED DELAY) 602 that receives a carrier frequency in the form of a clock signal CLK_IN, and generates a modulated output signal RF_OUT based on digital normalized delay control values $\varphi_i$. The modulated output signal RF_OUT is for example transmitted over an RF interface (not illustrated), for example via an antenna.

In one embodiment, the normalized delay circuit 602 is implemented by the circuit 200 of FIG. 2. Alternatively, other implementations described in more detail below could be used, that may or may not be based on thermometric code.

The modulator 600 also comprises a normalized delay calculator (NORMALIZED DELAY CALCULATOR) 604, which for example has an input receiving the modulated output signal RF_OUT. The normalized delay calculator 604 is for example a digital circuit clocked at least partially by the modulated output signal RF_OUT. For example, in some embodiments, the calculator 604 comprises one or more accumulators clocked by the output signal RF_OUT.

The normalized delay calculator 604 also for example comprises an input receiving phase samples PHASE and/or an input receiving frequency samples FREQ'.

The phase samples PHASE for example provide phase setpoints. They for example indicate a current desired phase (and not frequency) of the modulated RF output signal. Each phase sample PHASE for example indicates a target phase offset of the modulated output signal (RF_OUT) with respect to the input carrier signal CLK_IN. This implies for example that, in the absence of frequency samples, if the phase samples remain constant, the RF output signal will be fixed at a given phase offset with respect to the input carrier signal CLK_IN. The phase samples PHASE are for example received by the calculator 604 at a rate different to the frequency of the modulated output signal RF_OUT.

Each frequency sample FREQ' for example indicates a phase increment to be applied to the input carrier signal CLK_IN, this phase increment corresponding to a given target frequency of the modulated output signal RF_OUT. This implies for example that, in the absence of phase samples, if the frequency samples remain constant, the RF output signal will be at a fixed frequency different to that of the input carrier signal CLK_IN. In some embodiments, the frequency samples FREQ' are generated based on frequency modulation setpoints fi, as will be described in more detail below with reference to FIG. 7. The frequency samples FREQ' are for example received at a rate different to the frequency of the modulated output signal RF_OUT.

The normalized delay calculator 604 is for example configured to generate the digital normalized delay control values $\varphi_i$ based on the phase samples PHASE and/or the frequency samples FREQ', and to supply the digital normalized delay control values to the normalized delay circuit at the rate of the modulated output signal RF_OUT. For example, output circuitry of the normalized delay calculator 604 is clocked by the modulated output signal RF_OUT such that the digital normalized delay control values $\varphi_i$ are synchronous with the modulated output signal RF_OUT.

The normalized delay calculator 604 for example comprises an accumulator (not shown in FIG. 6) configured to directly accumulate, modulo 3600 and in the frequency domain of the modulated output signal RF_OUT, the frequency samples FREQ'. Additionally or alternatively, the normalized delay calculator 604 for example comprises an accumulator (also not shown in FIG. 6) configured to accumulate, modulo 360° and in the frequency domain of the modulated output signal RF_OUT, phase increments generated based on the phase samples PHASE.

The normalized delay calculator 604 generates, based on the frequency or phase samples, n-bit normalized delay control values $\varphi_i$, which are provided to the normalized delay circuit 602 for controlling the time delay introduced by the normalized delay circuit 602. The normalized delay control values $\varphi_i$ are for example binary values, or values in the thermometric code format, although other formats would also be possible.

In operation, the normalized delay calculator 604 for example receives the modulated output signal RF_OUT, and generates the digital normalized delay control values $\varphi_i$ based on the phase and/or frequency samples PHASE, FREQ'. For example, in some embodiments, this is performed by accumulating the phase increments and/or the frequency samples at a rate determined by the modulated output signal RF_OUT. This means that the period between consecutive rising edges of the signal RF_OUT depends on the period of the clock signal CLK_IN and on the phase shift applied by the normalized delay control values $\varphi_i$.

In the following description, example embodiments are described in which the accumulator, or each accumulator, of the normalized delay calculator 604 is directly clocked by the rising edges of the modulated output signal RF_OUT. However, it will be apparent to those skilled in the art how these embodiments could be modified in order for the accumulator, or each accumulator, of the normalized delay calculator 604 to be clocked by only certain edges of the modulated output signal RF_OUT, generated for example by dividing the modulated output signal.

Figure 7:
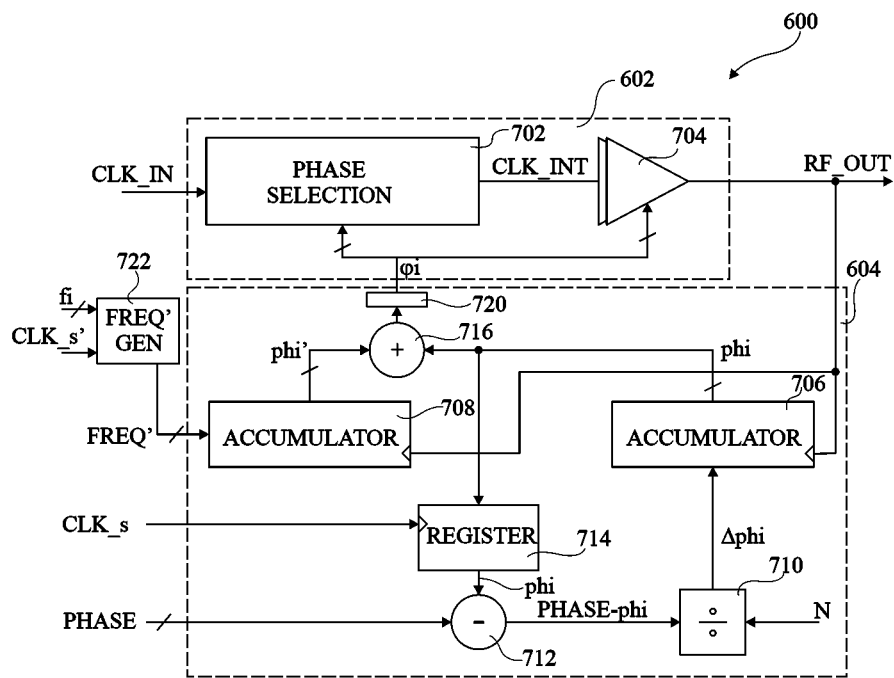
FIG. 7 schematically illustrates the polar phase and/or frequency modulator of FIG. 6 in more detail according to an example embodiment of the present disclosure.

FIG. 7 schematically illustrates the modulator 600 of FIG. 6 in more detail according to an example embodiment of the present disclosure in which it is capable of performing both phase and frequency modulation. Thus, the modulator 600 of FIG. 7 for example receives both the phase samples PHASE and frequency samples FREQ'.

The normalized delay circuit 602 comprises, in the example of FIG. 7, a phase selection circuit (PHASE SELECTION) 702 receiving at its input the clock signal CLK_IN corresponding to the modulation carrier frequency, and a variable delay circuit 704 receiving an output signal CLK_INT of the phase selection circuit 702, and generating the modulated output signal RF_OUT. For example, the phase selection circuit 702 provides a coarse phase selection based on one or more most significant bits (MSBs) of the normalized delay control values $\varphi_i$, and the variable delay circuit 704 provides a fine phase selection based on one or more least significant bits (LSBs) of the normalized delay control values $\varphi_i$.

In some embodiments, the normalized delay calculator 604 comprises at least one accumulator (ACCUMULATOR) 706 forming part of a phase modulation circuit, and/or at least one accumulator (ACCUMULATOR) 708 forming part of a frequency modulation circuit. The accumulators 706 and 708 are each for example clocked by the modulated output signal RF_OUT, and each for example performs integration in the frequency domain. However, as will be described in more detail below with reference to FIG. 21, it would also be possible to implement at least the phase modulation circuit without any accumulator.

The phase samples PHASE are for example received at a rate determined by the clock signal CLK_s, the frequency of the clock signal CLK_s being different to the frequency of the modulated output signal RF_OUT. The phase samples PHASE are for example processed to generate phase increments Δphi that are provided to the accumulator 706. These phase increments Δphi sampled at a sampling period Ts determined by a clock signal CLK_s (described in more detail below) represent a frequency Δphi/Ts. The frequency samples FREQ' are for example provided directly to the accumulator 708.

The accumulator 706 is for example configured to generate normalized delay control values phi, and the accumulator 708 is for example configured to generate normalized delay control values phi'.

In the example of FIG. 7, the phase modulation circuit comprises, in addition to the accumulator 706, an arithmetic divider 710, a subtractor 712 and a digital register (REGISTER) 714. The accumulator 706 is clocked by the modulated output signal RF_OUT of the normalized delay circuit 602. A data input of the accumulator 706 receives the phase increments Δphi generated by the divider 710, which for example divides a phase difference PHASE-phi by a factor N. The factor N corresponds for example to the ratio between the frequency $F_{in}$ of the input clock signal CLK_IN, and the sample frequency $F_s$ of the phase samples PHASE, that is to say $N=F_{in}/F_s$.

The phase difference PHASE-phi is generated by the subtractor 712, which receives at one input the phase samples PHASE, and receives, at its other input, phase samples phi from the register 714. The register 714 has its input coupled to the accumulator 706 output, from which it receives the phase values phi at the rate of the output signal RF_OUT. The register 714 is, moreover, clocked at the sample clock frequency CLK_s. Therefore, the register 714 performs resampling of the phase values phi. Thus, the register 714 output represents the last phase calculated by the accumulator 706, to which the next phase sample PHASE will be applied. The subtractor 712 provides the next phase increment during one period of CLK_s, while the phase increment Δphi is the next phase increment during one period of the modulated output signal RF_OUT. Therefore, the phase increment values Δphi are considered as frequencies.

The accumulator 706 performs the discrete integral of the input phase increments Δphi, for example by summing these increments in the frequency domain of the output signal RF_OUT.

The phase values phi from the accumulator 706 are also provided to an adder 716, which combines the phase values phi with phase values phi' based on the frequency modulation to generate the normalized delay control values $\varphi_i$.

The frequency modulation circuit for example comprises the accumulator 708, which receives, at the rate of a further clock signal CLK_s', the frequency samples FREQ', which indicate the phase shifts to be applied. The accumulator 708 is clocked by the modulated output signal RF_OUT. Therefore, the frequency samples FREQ' have, for example, been calculated taking into account the foreseen frequency of the modulated output signal RF_OUT, as discussed in more detail below. The accumulator 708 accumulates the frequency samples FREQ' and generates the phase values phi' at a rate determined by the modulated output signal RF_OUT. Like the accumulator 706, the accumulator 708 performs the discrete integral of the input frequency samples FREQ', for example by summing these samples in the frequency domain of the output signal RF_OUT.

The clock signal CLK_s' does not directly participate in the accumulation operation of the accumulator 708, and can therefore have any clock frequency below half the frequency of the modulated output signal RF_OUT.

The frequency samples represent the frequency modulation, which may correspond to data symbols and/or to an intermediate frequency, in the frequency domain of the output signal RF_OUT, and not that of the clock signal CLK_s', as will be described in more detail below.

In some embodiments, the digital normalized delay control values $\varphi_i$ are provided in thermometric code. For example, the phase values phi and phi' are binary values that are added by the adder 716, and the normalized delay calculator 604 further comprises an output circuit 720 for converting the binary values at the output of the adder 716 into the thermometric normalized delay control values $\varphi_i$.

The frequency samples FREQ' are for example provided by a frequency sample generator (FREQ' GEN) 722, which receives setpoint frequency values $f_i$ to be modulated, at a sample rate given by the clock signal CLK_s', the values $f_i$ indicating the frequency modulation to be applied. In some embodiments the frequency samples FREQ' ad setpoint frequency values $f_i$ each have the same sample rate, for example the one defined by the clock signal CLK_s'. It would however also be possible for their sample rates to be different, if for example the generator 722 comprises a decimation and/or interpolation filter.

The generator 722 is for example a hardware implementation comprising arithmetic circuits. However, in alternative embodiments, the generator 722 could be at least partially implemented in software, the generator 722 for example comprising one or more processors under the control of instructions stored in an instruction memory (not illustrated in FIG. 7). Alternatively, the generator 722 could be omitted, for example if there is a predefined number of frequency setpoints $f_i$, and corresponding frequency samples FREQ' indicating the phase increments to be applied have been calculated in advance. For example, in some embodiments, rather than receiving the setpoint frequency values $f_i$ to be modulated and calculating the samples FREQ' in real time, the generator 722 could correspond to, or be replaced by, a static register storing the pre-calculated samples FREQ'.

In some embodiments, the clock signals CLK_s and CLK_s', at which the phase and frequency samples PHASE and FREQ' are respectively provided, are each derived from the clock signal CLK_IN. However, in alternative embodiments, the clock signals CLK_s and CLK_s' could be asynchronous with each other, as in any case the samples PHASE and FREQ' are independently resynchronized with the output signal RF_OUT. The clock signals CLK_s and CLK_s' are each for example equal to $\alpha F_{in}$, where a is for example equal to or less than 0.5, and the value of a may be different for each of the clock signals CLK_s and CLK_s'.

While the embodiment of the modulator 600 of FIG. 7 is capable of performing both phase and frequency modulation, in alternative embodiments the frequency modulation circuit could be omitted, such that the modulator 600 is capable of performing only phase modulation (or frequency modulation only via the phase modulation circuit), or the phase modulation circuit could be omitted, such that the modulator 600 is capable of performing only frequency modulation (or phase modulation only via the frequency modulation circuit).

Furthermore, it is also possible to perform both frequency and phase modulation at the same time. For example, frequency modulation could be applied via the frequency samples FREQ' to modulate based on a fixed intermediate frequency, and phase modulation could be added to encode data symbols using the phase samples PHASE.

It would also be possible in the embodiment of FIG. 7 to perform phase modulation via the input signal FREQ', and to perform frequency modulation via the phase input PHASE. However, in some cases performance may be degraded, as will be explained in more detail below.

Figure 8:
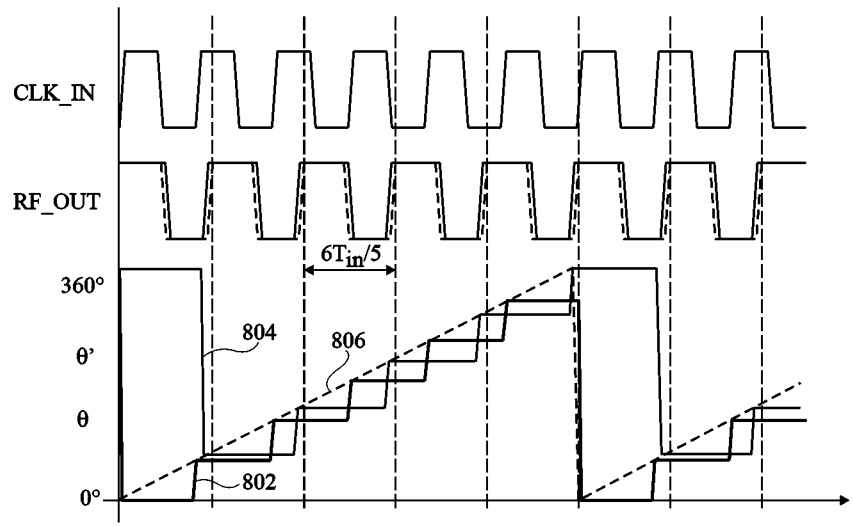
FIG. 8 is a timing diagram providing a mathematical demonstration leading to the calculation of frequency samples.

FIG. 8 is a timing diagram providing a mathematical demonstration leading to the calculation of frequency samples. FIG. 8 illustrates in particular examples of the clock signal CLK_IN, the modulated output signal RF_OUT, a mathematical variable θ (curve 802) at the frequency $F_{in}$ of the clock signal CLK_IN and a mathematical variable θ' (curve 804).

The aim of frequency modulation is to modulate a frequency $f_i$ on a carrier frequency $F_{in}$ of the clock signal CLK_IN. In the general case, the phase θ(t) produced by a frequency f(t) is as follows:

$$\theta(t) = 2\pi \int f(t) \cdot dt \qquad [\text{Eq. 5}]$$

This equation can be applied to frequency samples $f_i$ sampled at periods $T_s'$ of the signal CLK_s', such that the phase $\theta_i = \theta_{i-1} + 2\pi T_s' \cdot f_i$.

The term $\Delta\theta = 2\pi \cdot T_s' \cdot f_i$ is the phase jump from one sample to the next that should be accumulated in order to provide the current phase. In the frequency domain of $F_{in}$ with period $T_{in} = T_s/N$, where $T_s$ is equal to $1/F_s$, this phase jump becomes $2\pi \cdot T_{in} \cdot f_i$, that is to say $\Delta\theta/N$.

When passing to the frequency domain $F_{RF}$ of the modulated output signal RF_OUT, with period $T_{RF}$, the phase becomes $\theta'_i = \theta'_{i-1} + 2\pi T_{RF} \cdot f_i$, with $1/T_{RF} = F_{RF} = F_{in} - f_i$. Thus, in the frequency domain $F_{RF}$, the phase jumps $\Delta\theta'$ are equal to:

$$\Delta\theta' = \frac{2\pi \cdot T_{in} \cdot \Delta\theta}{2\pi \cdot T_s' - T_{in} \cdot \Delta\theta} \qquad [\text{Eq. 6}]$$

The illustration of FIG. 8 assumes a frequency modulation of a carrier $F_{in} = 1/T_{in}$ with $f_i = F_{in}/6$. The phase jumps are therefore, in the domain $T_s' = T_{in}$ (N=1), $\Delta\theta = \pi/3$. In the frequency domain of the modulated output signal RF_OUT, the phase jumps are different and equal to $\Delta\theta' = 2\pi/5$.

In one example, the frequency samples FREQ' are in the form of $N_f$-bit signed binary values that indicate normalized phase jumps provided at intervals of $T_s'$ corresponding to the period of the clock CLK_s'. In the accumulator 708, the samples FREQ' are resampled at the frequency $F_{RF}$ of the modulated output signal RF_OUT:

$$FREQ' = \frac{\Delta\theta \cdot T_{in} \cdot 2^{N_f}}{2\pi \cdot T_s' - T_{in} \cdot \Delta\theta} \qquad [\text{Eq. 7}]$$

where $\Delta\theta = 2\pi \cdot T_s' \cdot f_i$ and $N_f$ is the number of bits of each of the frequency samples FREQ'. The samples FREQ' can also be expressed as:

$$FREQ' = \frac{f_i \cdot 2^{N_f}}{F_{in} - f_i} \qquad [\text{Eq. 8}]$$

where $F_{in}$ is the frequency of the clock signal CLK_IN.

In the case that the frequency modulation is used only to modulate the carrier frequency with a fixed intermediate frequency, the frequency samples FREQ' are then of a fixed constant value, which can for example be calculated in advance and stored for example in a register.

In the case that the frequency modulation is to be used to transmit data symbols, with or without the addition of a frequency modulation at an intermediate frequency, the frequency samples FREQ' are for example generated in real time by appropriate arithmetic operators and/or by one or more processors under control of software instructions.

In some embodiments, the absolute value of the frequency FREQ' to be modulated is in the range:

$$FREQ'_{min} \leq FREQ' \leq FREQ'_{max} \qquad [\text{Eq. 9}]$$

where:

$$FREQ'_{min} = -2^{N_f-1} + 1 \qquad [\text{Eq. 10}]$$

and $$FREQ'_{max} = 2^{N_f-1} - 1 \qquad [\text{Eq. 11}]$$

It can be deduced from FIG. 8 that the phase values of variable θ' perfectly correspond to the samples of phi' that will be calculated by the accumulator 708.

Figure 9:
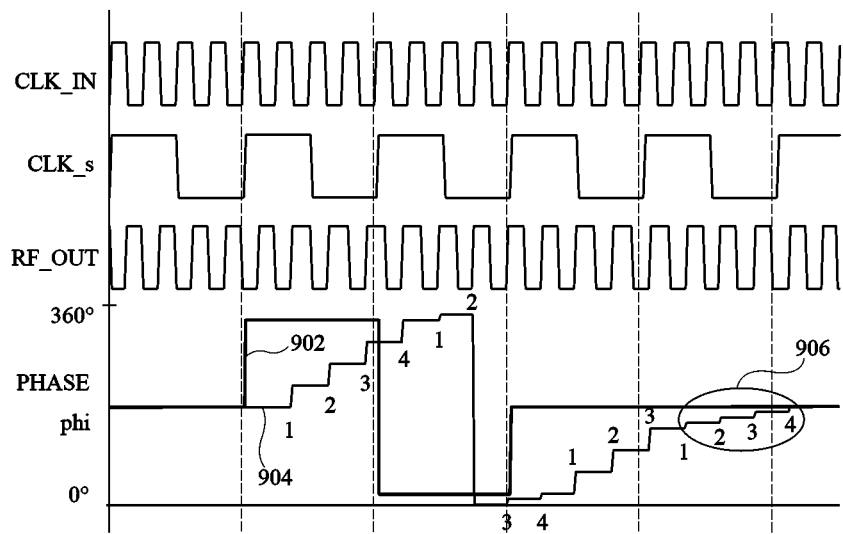
FIG. 9 is a timing diagram illustrating an example of polar phase modulation using the modulator of FIG. 7 according an example embodiment of the present disclosure.

FIG. 9 is a timing diagram illustrating an example of polar phase modulation using the modulator of FIG. 7 according an example embodiment of the present disclosure. FIG. 9 illustrates in particular examples of the clock signal CLK_IN, the clock signal CLK_s, the modulated output signal RF_OUT, phase samples PHASE at the frequency $F_s$ of the clock signal CLK_s, which are represented by a curve 902, and the phase values phi at the output of the accumulator 706, which are represented by a curve 904.

The phase samples PHASE are for example signed or unsigned binary values of Np bits.

It will be noted from FIG. 9 that the phase samples PHASE are provided at the frequency of the clock signal CLK_s, and that this is also the frequency at which the phase values phi are sampled by the register 714. Each resampled value of phi is subtracted from the sample PHASE in order to calculate the phase shift to be applied during the subsequent cycle of the clock signal CLK_s. This phase shift is a signed value that can be seen as a phase error correction in the feedback loop of the value phi. In order to provide the phase increments in the frequency domain of the clock signal CLK_IN, the division by N is performed by the divider 710, resulting in phase increments Δphi. The period $T_s$ of the clock signal CLK_s being equal to $N \cdot T_{in}$, the division by N evenly spreads the phase shift over N cycles of the clock signal CLK_IN during one period $T_s$. This operation therefore corresponds to a linear interpolation of the phase shift in view of its resampling at the frequency $F_{RF}$. It should be noted that this approximation is valid given that the average frequency of the frequency FR of the modulated signal RF_OUT remains centered on the frequency $F_{in}$ of the clock signal CLK_IN, and in view of the fact that the modulation does not produce phase shifts greater than $+/-\pi/N$. When the frequency $F_{RF}$ differs from the frequency $F_{in}$ while N remains at $F_{in}/F_s$, it is assumed that phi diverges from the foreseen phase as long as the feedback of phi has not yet corrected this error. Phase correction occurs on the next cycle of the clock signal CLK_S.

In some embodiments, the value of N is a power of 2. This has the advantage that the division by N corresponds merely to a shift to the right of the bits of the phase shift PHASE-phi.

In the example of FIG. 9, N=4, and the phase shifts are relatively high, the phase starting at 180°, going to 342° (1.9π radians), then falling to 18° (0.1π radians), before rising again to 180°. In view of the modulo phase shifts, the phase shift from 342° to 18° is not a big shift of −324° (1.8π radians), but a small shift of +36° (+0.2π radians).

The first phase shift from 180° to 342° is divided, as expected, into four equal phase increments of ¼ of the phase shift, labelled 1 to 4 in FIG. 9. However, for the shift from 18 to 180°, only three phase increments 1 to 3 are performed. This is the consequence of having made a full revolution of the unit circle, as by removing 360° from the phase, a cycle of RF_OUT has also disappeared. Therefore, the phase of phi' does not reach 1800 at the end of the cycle $T_s$ of the clock signal CLK_s, but thanks to the calculation of the difference between the previous value of phi and the new phase sample PHASE, the phase increments are compensated during the next cycles so that the phase does indeed tend towards 180°, as represented by the zone 906.

Rather than using the phase modulation circuit formed by the elements 706, 710, 712 and 714 of FIG. 7, it would also be possible to apply phase modulation using the frequency modulation circuit, via the samples FREQ'. However, an advantage of using the phase modulation circuit is that this provides an implementation that is relatively precise and of low complexity. Using the input frequency sample FREQ' would on the contrary involve a real-time calculation of the equation given in Equation 8 above, which would be relatively demanding on processing resources. Furthermore, even if the samples FREQ' were provided with relatively high precision, for example up to 32 bits, there would always be rounding errors in the calculations and in view of the resampling by the output signal RF_OUT, leading to a deviation of the phase from the targeted level.

Figure 10:
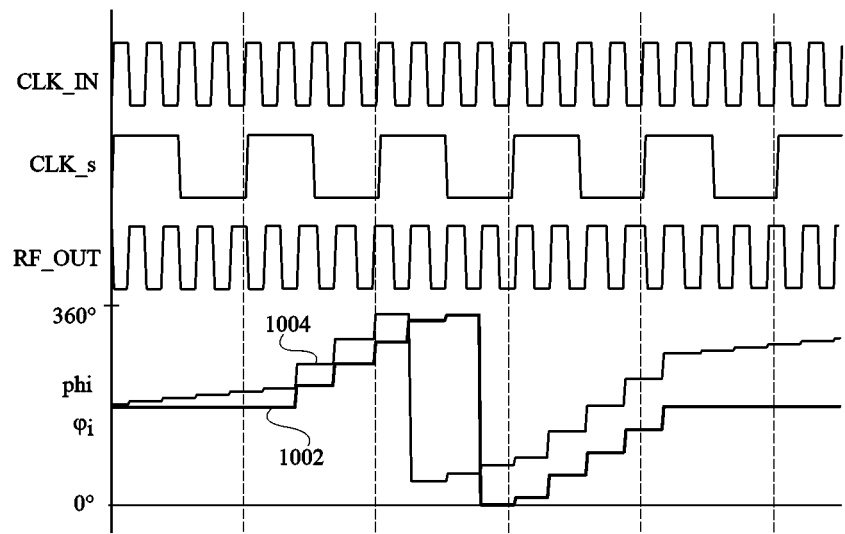
FIG. 10 is a timing diagram illustrating the superposition of an intermediate frequency according an example embodiment of the present disclosure.

FIG. 10 is a timing diagram illustrating the superposition of an intermediate frequency according an example embodiment of the present disclosure. In particular, FIG. 10 illustrates examples of the signals CLK_IN, CLK_s, RF_OUT, the phase values phi represented by a curve 1002, and the combined phase values $\varphi_i$ represented by a curve 1004, for a case in which the same phase modulation as in the example of FIG. 9 is applied, and in addition, an intermediate frequency is added using the frequency modulation circuit via the frequency samples FREQ'.

The combined phase values $\varphi_i$ are the sum of the phase values phi and phi', leading to a slightly reduced frequency of the modulated output signal RF_OUT. In view of this reduced frequency, the phase values phi are also modified, and in particular, the effect of the modulo 180° occurs one cycle earlier during the phase shift from 342° to 18°, leading to a correction in the next cycle of the clock CLK_s without additional cycle. Indeed, the zone 906 of FIG. 9 represents an additional cycle, corresponding to a phase catch-up cycle to compensate for the missing phase from the previous cycle caused by the fact that phi was calculated at the rate of the modulated output signal RF_OUT rather than at the rate of input signal CLK_IN. In the case of FIG. 10, as the modulated output signal RF_OUT is additionally modulated by phi', the frequency is different, and so the calculation of phi is not performed at the same time instants, and there is not a phase error to be corrected during an additional cycle.

Figure 11:
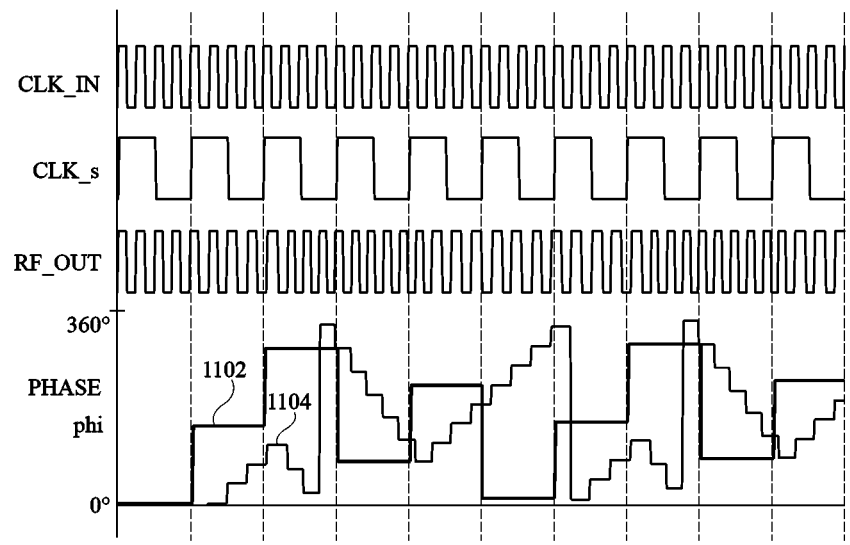
FIG. 11 is a timing diagram illustrating an effect of inversion of the phase variation during frequency modulation at a frequency of more than half the sampling frequency.

FIG. 11 is a timing diagram illustrating an effect of inversion of the phase variation during frequency modulation at a frequency $f_i$ greater than $F_s/2$ based on phase samples. FIG. 11 illustrates in particular examples of the clock signal CLK_IN, the clock signal CLK_s, the modulated output signal RF_OUT, phase samples PHASE at the frequency $F_s$ of the clock signal CLK_s, which are represented by a curve 1102, and the phase values phi at the output of the accumulator 706, which are represented by a curve 1104.

It would be possible to use the phase modulation circuit to apply frequency modulation by converting the frequency modulation values into phase samples. However, the calculation applies phase variations modulo $+/-180°$. Therefore, as represented by FIG. 11, when the desired frequency modulation $f_i$ exceeds $+/-180°$, the phase increments will be inverted, leading to phase decrements instead of increments. Therefore, in the case that the phase samples PHASE are to be used to apply frequency modulation, the absolute value of the frequency $f_i$ to be modulated is for example strictly less than $F_s/2$, in other words $f_i < F_s/2$.

Figure 12:
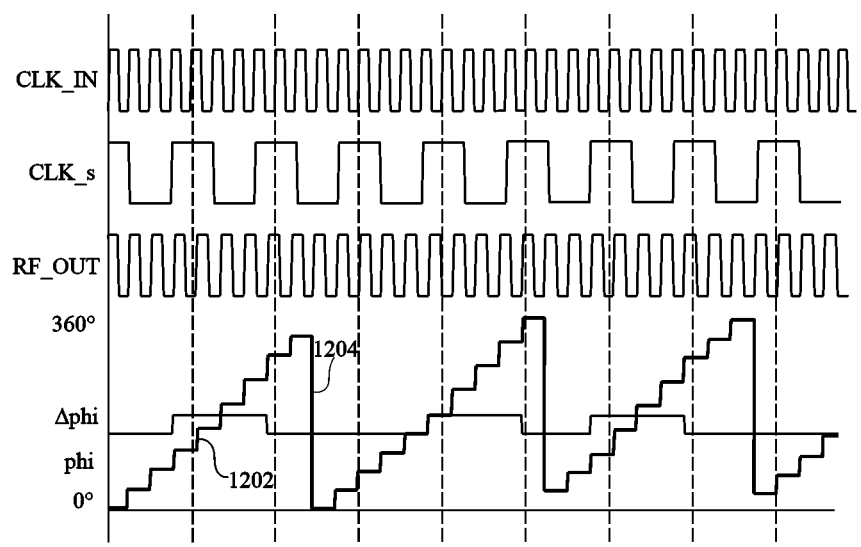
FIG. 12 is a timing diagram illustrating parasitic emissions during frequency modulation based on phase samples.

FIG. 12 is a timing diagram illustrating parasitic or spurious emissions during frequency modulation based on phase samples. FIG. 12 illustrates particular examples of the clock signal CLK_IN, the clock signal CLK_s, the modulated output signal RF_OUT, the phase values phi at the output of the accumulator 706, which are represented by a curve 1102, and the phase increments Δphi, which are represented by a curve 1104.

In the example of FIG. 12, the frequency modulation is based on a constant frequency $f_i$, and is lower than $+/-180°$. However, it will be noted that the phase increments Δphi are not constant, which could generate parasitic frequencies on the modulated signal RF_OUT.

Therefore, in some embodiments, phase modulation is only applied via the phase samples PHASE, and frequency modulation is only applied via the frequency samples FREQ'.

Figure 13:
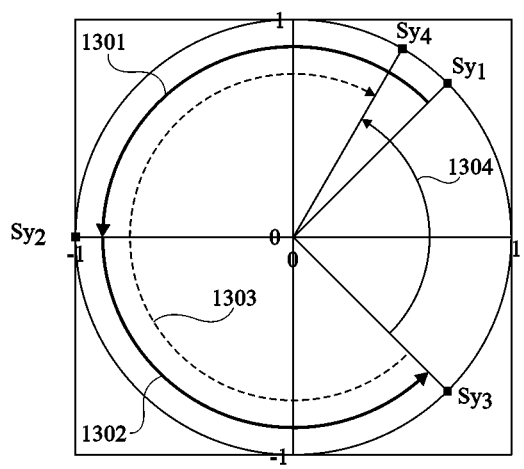
FIG. 13 is a unit circle representing a difference in the phase modulation capacity with respect to a prior art modulation technique.

FIG. 13 is a unit circle representing a difference in the phase modulation capacity with respect to a prior art modulation technique. In particular, FIG. 13 illustrates an example based on four symbols $Sy_1$, $Sy_2$ $Sy_3$ and $Sy_4$ to be transmitted, where for example $Sy_1=45°$, $Sy_2=180°$, $Sy_3=315°$ and $Sy_4=55°$. Arrows 1301 and 1302 respectively represent the phase shifts for transitioning from the symbol $Sy_1$ to the symbol Sy$_2$, and from the symbol Sy$_2$ to the symbol Sy$_3$. An arrow 1303 represents a typical manner of transitioning from the symbol Sy$_3$ to the symbol Sy$_4$ based on phase reductions without making a full phase revolution, in other words without passing through 360°. However, a drawback of this approach is that it can lead to an undesirable emission spectrum.

The arrow 1304 in FIG. 13 represents a transition from the symbol Sy$_3$ to the symbol Sy$_4$ that is possible using the modulator 600 of FIG. 6 of the present application. In particular, the full turn of the unit circle becomes possible without causing undesirable parasitic frequencies thanks to the synchronization between the phase increments and/or frequency samples and the modulated output signal RF_OUT.

Furthermore, it becomes possible to modulate based on frequency as well as phase. For example, this can allow the introduction of an intermediate frequency higher or lower than the carrier frequency Fe of the carrier signal (the clock signal CLK_IN in the example of FIGS. 6 and 7) in addition to phase modulation. Therefore, even if the carrier frequency $F_c$ is fixed, it is possible to address a plurality of RF channels at different frequencies without the need of a variable frequency synthesizer. For example, the clock signal CLK_IN or other fixed carrier can be a reference signal generated for example by a quartz oscillator or another source, or by a simple frequency multiplier based on a further reference frequency generated by a quartz oscillator.

Figure 14:
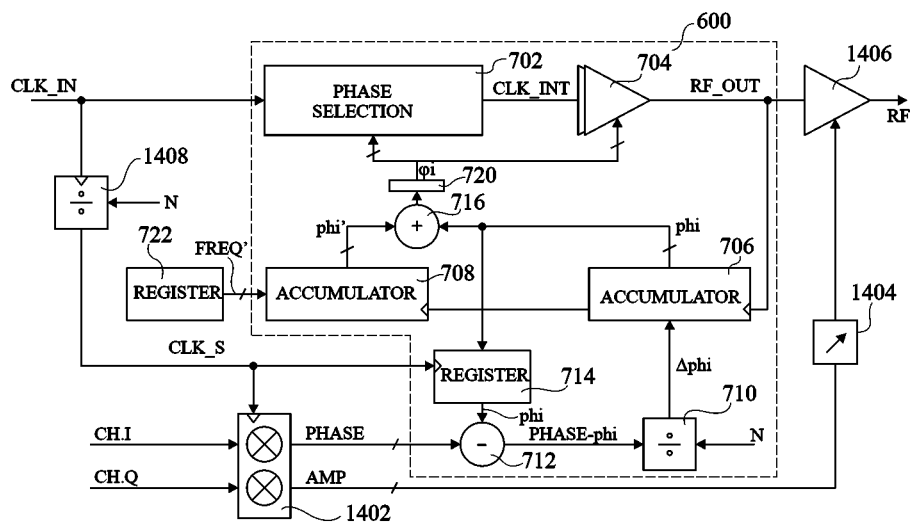
FIG. 14 schematically illustrates a polar modulation circuit according to an example embodiment of the present disclosure.

FIG. 14 schematically illustrates a polar modulation circuit 1400 comprising the polar phase and/or frequency modulator 600 of FIG. 6. The modulator 600 will not be described again in detail. In the example of FIG. 14, the modulation circuit receives an I channel (CH.I) and a Q channel (CH.Q) representing symbols to be encoded.

The I and Q channels are for example provided to a cordic to polar converter 1402, which is for example clocked by the clock signals CLK_s, and outputs the phase samples PHASE, and amplitude samples AMP.

The channels I and Q have for example been generated by an IQ modulator (not illustrated in FIG. 14) based on the symbols to be transmitted. This modulator is for example a PSK (phase shift keying), MSK (minimum-shift keying), QPSK (Quadrature phase-shift keying), or QAM (quadrature amplitude modulation) modulator or any other type of modulator comprising phase modulation. In some embodiments, this modulator is not a frequency modulator. Furthermore, the generation of the I and Q channels may involve digital filtering in some cases.

In alternative embodiments, rather than converting from the Cartesian IQ representation, the input could be directly in a polar representation, and no IQ modulator, digital filter or cordic to polar converter is provided. Moreover, in some cases, the modulation could be at constant envelope, wherein the amplitude is fixed, and the phase is directly provided by the symbols themselves.

The phase samples PHASE are provided to the subtractor 712 of the modulator 600 has described above.

The amplitude samples AMP are for example transmitted, via a delay circuit 1404, to an amplifier 1406.

The amplifier 1406 for example receives the modulated output signal RF_OUT from the modulator 600, and amplifies this signal by gains determined based on the amplitude samples to generate an RF output signal RF for transmission via an antenna (not illustrated in the figures).

The clock signal CLK_s is for example generated by a frequency divider 1408, which divides the input clock signal CLK_IN by N to generate the clock signal CLK_s.

The frequency sample generator 722 for example comprises, in the example of FIG. 14, a digital register (REGISTER) 722.

An advantage of the modulator 600 when used in a system like that of FIG. 14 is that the delay introduced between each phase sample PHASE and the corresponding edge of the modulated signal RF_OUT is relatively constant and predictable. Therefore, it is relatively easy to compensate for this delay using the delay circuit 1404 so that the phase and amplitude samples are delayed by the same amount and thus reach the amplifier 1406 at the same time. In some embodiments, the delay circuit 1404 is a variable delay that is tunable to match the delay applied to the phase by the modulator 600.

On the contrary, in other types of polar transmitters based on frequency synthesizers comprising phase locked loops, it is far harder to determine and correct differences between the delays to which the amplitude and phase samples are subjected.

Figure 15:
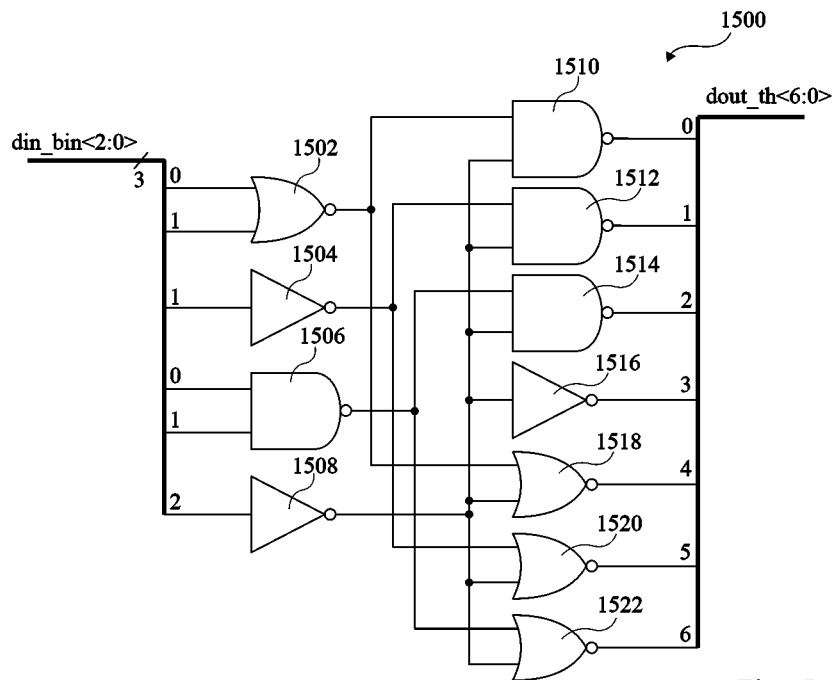
FIG. 15 schematically illustrates a decoder for converting a 3-bit input into a 7-bit thermometric code according to an example embodiment of the present disclosure.

FIG. 15 schematically illustrates a decoder 1500 for converting a 3-bit binary input into a 7-bit thermometric code. For example, the decoder 1500 implements the output circuit 720 of the normalized delay calculator 604 of the modulator 600 of FIG. 7, in the case that the normalized delay circuit 602 operates based on a thermometric code input. It will be apparent to those skilled in the art how such a circuit could be adapted to generating a thermometric code of $2^M-1$ bits based on an M-bit input binary value.

The decoder 1500 receives the binary input value din_bin<2:0> having three bits 0, 1 and 2. The bit bits 0 and 1 are provided to respective inputs of a two-input NOR gate 1502, the bit 1 is provided to the input of an inverter 1504, the bits 0 and 1 are provided to respective inputs of a two-input NAND gate 1506, and the bit 2 is provided to the input of an inverter 1508.

The decoder 1500 outputs the thermometric code dout_th<6:0> having seven bits 0 to 6. The output of the inverter 1508 is coupled to one input of:

a two-input NAND gate 1510 providing the output bit 0;
a two-input NAND gate 1512 providing the output bit 1;
a two-input NAND gate 1514 providing the output bit 2;
an inverter 1516 providing the output bit 3;
a two-input NOR gate 1518 providing the output bit 4;
a two-input NOR gate 1520 providing the output bit 5; and
a two-input NOR gate 1522 providing the output bit 6.

The output of the NOR gate 1502 is coupled to the second input of the NAND gate 1510 and to the second input of the NOR gate 1518.

The output of the inverter 1504 is coupled to the second input of the NAND gate 1512 and to the second input of the NOR gate 1520.

The output of the NAND gate 1506 is coupled to the second input of the NAND gate 1514 and to the second input of the NOR gate 1520.

The decoder 1500 has the truth table defined in the following table:

TABLE 1

| din_bin<2:0> | dout_th<6:0> | din_bin<2:0> | dout_th<6:0> |
|---|---|---|---|
| 000 | 0000000 | 100 | 0001111 |
| 001 | 0000001 | 101 | 0011111 |
| 010 | 0000011 | 110 | 0111111 |
| 011 | 0000111 | 111 | 1111111 |

Of course, FIG. 15 merely provides one example of an implementation of a binary to thermometric code decoder, there being many possible alternative logic implementations.

An advantage of using a thermometric code is that this allows a reduction in the effects resulting from dispersion between the capacitance values of the capacitors used by the normalized delay circuit 602.

Figure 16:
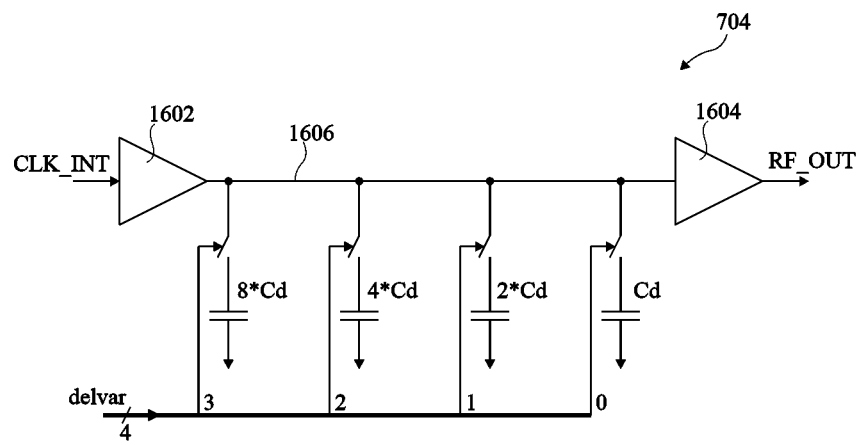
FIG. 16 schematically illustrates a 4-bit variable delay circuit based on capacitor switching according to an example embodiment of the present disclosure.

FIG. 16 schematically illustrates an example implementation of the variable delay circuit 704 of FIG. 7.

In the example of FIG. 16, the circuit 704 is controlled by a 4-bit binary control signal delvar, and therefore binary to thermometric code conversion is not necessary. The circuit 704 comprises an input buffer 1602, which for example receives the clock input signal CLK_INT from the phase selection circuit 702, and an output buffer 1604, which for example provides the modulated output signal RF_OUT. The output of the buffer 1602 is connected to the input of the buffer 1604 by a delay line 1606 having a variable capacitance. In particular, four capacitors respectively having capacitances of Cd, 2*Cd, 4*Cd and 8*Cd each have one of their terminals coupled to the delay line 1606 via a corresponding switch, and their other terminal coupled to a ground rail. The switches are controlled by corresponding bits of the input control signal delvar.

Figure 17:
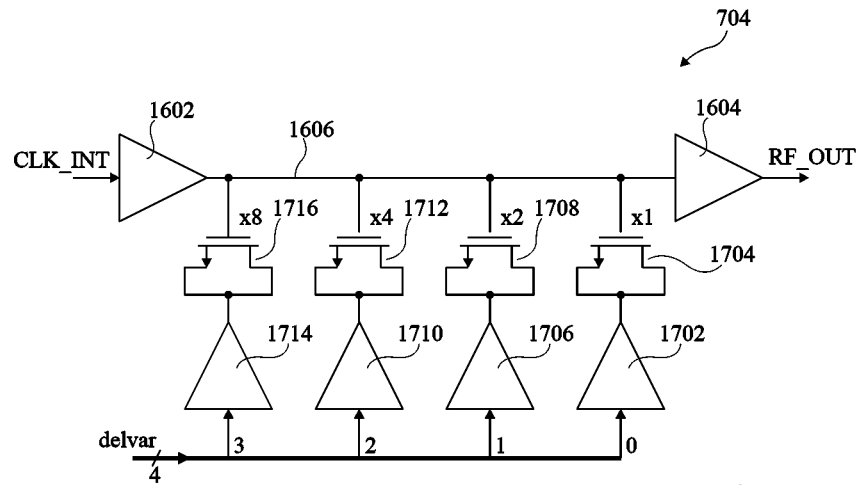
FIG. 17 schematically illustrates a 4-bit variable delay circuit based on varactor effects according to an example embodiment of the present disclosure.

FIG. 17 schematically illustrates an example implementation of the variable delay circuit 704 of FIG. 7 similar to that of FIG. 16, and like features between FIGS. 16 and 17 have been labelled with the same reference numerals and will not be described again in detail.

In the embodiment of FIG. 17, the capacitors and switches are replaced by MOS transistor gates and buffers. In particular, a bit 0 of the control signal delvar is coupled to the delay line 1606 via a buffer 1702 and the gate of a single MOS transistor 1704, which is for example an n-channel MOS transistor. For example, the output of the buffer 1702 is coupled to the source and drain of the transistor 1704, and the gate of the transistor 1704 is coupled to the delay line 1606. Similarly, a bit 1 of the control signal delvar is coupled to the delay line 1606 via a buffer 1706 and the gate of two parallel MOS transistors 1708, a bit 2 of the control signal delvar is coupled to the delay line 1606 via a buffer 1710 and the gate of four parallel MOS transistors 1712, and a bit 3 of the control signal delvar is coupled to the delay line 1606 via a buffer 1714 and the gate of eight parallel MOS transistors 1716. The capacitance of the gate of an n-channel MOS transistor increases, in view of varactor effects, as a function of the voltage at its source and drain, and therefore a relatively linear capacitance variation can be obtained in the embodiment of FIG. 17 as a function of the value of the input control signal delvar.

In some embodiments, the variable delay circuit 704 of FIG. 16 or 17 is used in conjunction with the phase selection circuit 702 of FIG. 7, and the signal delvar for example corresponds to a number of the least significant bits of the phase control signal $\varphi_i$. Alternatively, the variable delay circuit of FIG. 16 or 17 could be the only circuit of the normalized delay circuit 602 of FIG. 6, and the signal delvar could correspond to all of the bits of the phase control signal $\varphi_i$.

Of course, while FIGS. 16 and 17 illustrate examples of 4-bit variable delay circuits, these embodiments could be extended to any number of bits. Furthermore, it will be apparent to those skilled in the art how these embodiments could be adapted to operate based on a thermometric code, by replacing the binary weighting of the capacitances by a uniform weighting and increasing the number of capacitive branches accordingly.

Figure 18:
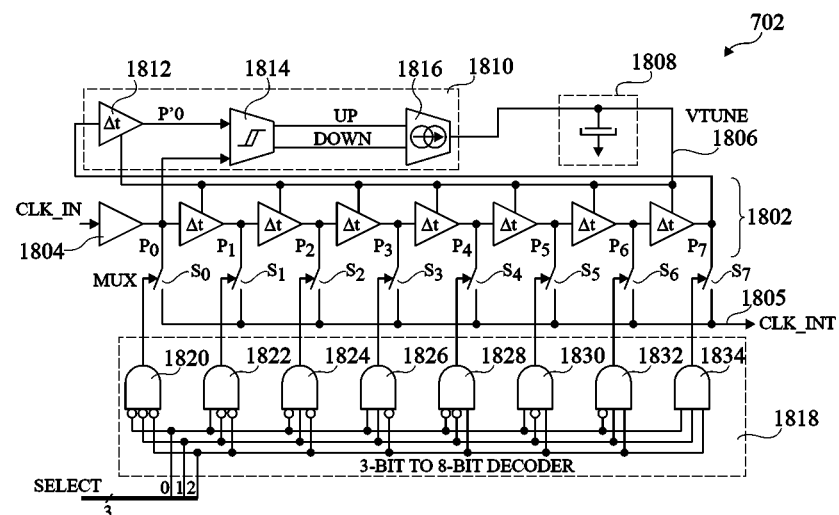
FIG. 18 schematically illustrates a phase selection circuit of the modulator of FIG. 7 in more detail according to an example embodiment of the present disclosure.

FIG. 18 schematically illustrates an example implementation of the phase selection circuit 702 of FIG. 7. For example, the circuit 702 is used in conjunction with the variable delay circuit 704, the circuit 702 providing coarse phase selection, and the circuit 704 providing fine phase adjustment. However, alternatively, the phase selection circuit 702 could be used alone without a further variable delay circuit.

In the example of FIG. 18, the circuit 702 comprises a delay line 1802 formed of the series connection of succession of delay elements Δt, a first of these delay elements having its input coupled to the output of a buffer 1804 receiving the clock signal CLK_IN. The total delay introduced by the delay line is for example variable between 0 and (360°-Δp), where Δp is the phase increment of each delay element. The number of delay elements Δt depends on the number of phases to be selected in the selectable phase range. In the example of FIG. 18, there are seven delay elements Δt that each for example introduces a delay of 45°. The output of the buffer 1804 for example provides a first phase signal $P_0$, and the outputs of the successive delay elements Δt provide corresponding phase signal $P_1$ to $P_7$, where the phases are for example as follows:

$P_0$: 0°;
$P_1$: 45°;
$P_2$: 90°;
$P_3$: 135°;
$P_4$: 180°;
$P_5$: 225°;
$P_6$: 270°; and
$P_7$: 315°.

Each of the phase signals $P_0$ to $P_7$ is for example provided via a corresponding switch $S_0$ to $S_7$ to an output line 1805 providing the output signal CLK_INT of the phase selection circuit 702.

A tuning voltage VTUNE is for example provided on a line 1806 to a tuning input of each of the delay elements Δt in order to tune the delay introduced by each delay element. This voltage VTUNE is for example stored on a capacitor 1808 and regulated by a control circuit 1810 forming a delay locked loop.

For example, the control circuit 1810 comprises a further delay element Δt 1812 receiving the phase signal $P_7$ and also, at a tuning input, the tuning voltage VTUNE. The phase of the phase signal $P'_0$ at the output of the delay element 1812 is compared by a comparator 1814 with the phase of the phase signal $P_0$, and control signal UP and DOWN are generated as a function of the phase difference. Indeed, the phase signals $P_0$ and $P'_0$ should have a time delay of one cycle of the clock signal CLK_IN corresponding to 360°, and thus they should be in phase with each other.

The control signals UP and DOWN drive a charge pump 1816, which in turn charges or discharges the capacitor 1808 in order to adjust the tuning voltage VTUNE. In this way, the phase delay Δp introduced by each delay element Δt is for example controlled to converge to a value at which the signals $P_0$ and $P'_0$ are in phase.

The switches $S_0$ to $S_7$ for example form a MUX controlled by a 3-bit to 8-bit decoder (3-BIT TO 8-BIT DECODER) 1818, which converts a 3-bit selection signal SELECT into an 8-bit control signal in which only one bit is high and the remaining bits low. For example, when the signal SELECT has the binary value "000", the control signals of the switches $S_7$ to $S_0$ are respectively at "00000001", when the signal SELECT has the binary value "001", the control signals of the switches $S_7$ to $S_0$ are respectively at "00000010", etc., and when the signal SELECT has the binary value "111", the control signals of the switches $S_7$ to $S_0$ are respectively at "10000000".

The decoder 1818 for example comprises:
- a 3-input NAND gate 1820 receiving at its inputs the bits 0, 1 and 2 of the selection signal SELECT and generating the control signal of the switch $S_0$;
- a 3-input AND gate 1822 receiving at its inputs the bit 0, and the inverted bits 1 and 2, of the selection signal SELECT and generating the control signal of the switch $S_1$;
- a 3-input AND gate 1824 receiving at its inputs the bit 1, and the inverted bits 0 and 2, of the selection signal SELECT and generating the control signal of the switch $S_2$;
- a 3-input AND gate 1826 receiving at its inputs the bits 0 and 1, and the inverted bit 2, of the selection signal SELECT and generating the control signal of the switch $S_3$;
- a 3-input AND gate 1828 receiving at its inputs the bit 2, and the inverted bits 0 and 1, of the selection signal SELECT and generating the control signal of the switch $S_4$;
- a 3-input AND gate 1830 receiving at its inputs the bits 0 and 2, and the inverted bit 1, of the selection signal SELECT and generating the control signal of the switch $S_5$;
- a 3-input AND gate 1832 receiving at its inputs the bits 1 and 2, and the inverted bit 0, of the selection signal SELECT and generating the control signal of the switch $S_6$; and
- a 3-input AND gate 1822 receiving at its inputs the bits 0, 1 and 2 of the selection signal SELECT and generating the control signal of the switch $S_7$.

The selection signal SELECT for example corresponds to the three most significant bits of the phase control signal $\varphi_i$, or in the case that the circuit 702 is used without a further variable delay circuit, selection signal SELECT for example corresponds to all of the bits of the phase control signal $\varphi_i$.

Of course, the while the example of FIG. 18 is based on a phase selection circuit having eight phases selectable by a 3-bit selection signal, in alternative embodiments there could be a different number of phases selectable by a selection signal of a different number of bits. It will also be apparent to those skilled in the art how the decoder 1818 could be adapted to operate based on a thermometric code selection signal rather than a binary selection signal.

Figure 19:
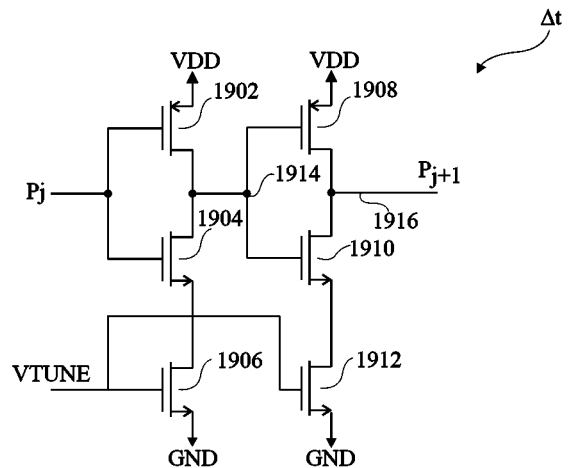
FIG. 19 schematically illustrates a delay cell of the circuit of FIG. 18 in more detail according to an example embodiment of the present disclosure.

FIG. 19 schematically illustrates one of the delay elements Δt of the phase selection circuit 702 of FIG. 18 in more detail according to an example embodiment. Each delay element Δt is for example formed of the series connection of three transistors 1902, 1904 and 1906 between VDD and ground (GND) supply rails, the transistors 1902 and 1904 having their gates coupled to the phase signal $P_j$, where j designates the delay element and is equal to 0 to 6 in the example of FIG. 18. Each delay element Δt is for example further formed of the series connection of three transistors 1908, 1910 and 1912 between the VDD and ground (GND) supply rails, the transistors 1908 and 1910 having their gates coupled to a node 1914 between the transistors 1902 and 1904.

The gates of the transistors 1906 and 1912 are for example controlled by the tuning voltage VTUNE. An output node 1916 between the transistors 1908 and 1910 for example provides the phase signal $P_{j+1}$.

The transistors 1902 and 1908 are for example p-channel MOS transistors, and the transistors 1904, 1906, 1910 and 1912 are for example n-channel MOS transistors.

Figure 20:
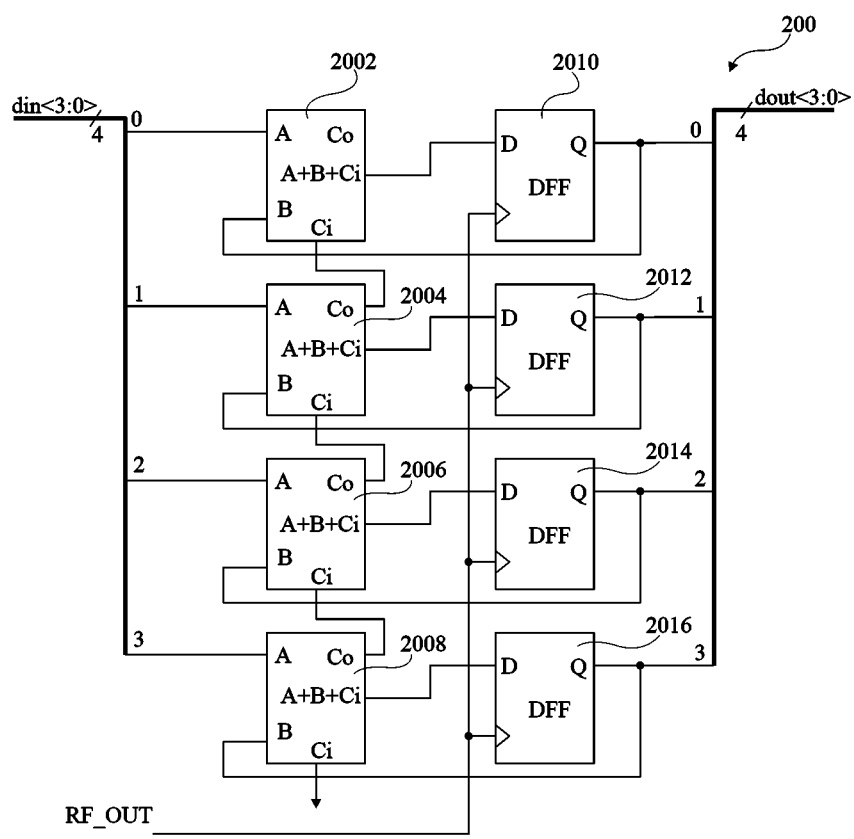
FIG. 20 schematically illustrates a 4-bit accumulator according to an example embodiment of the present disclosure.

FIG. 20 schematically illustrates an example of a 4-bit accumulator 2000 according to an example embodiment of the present disclosure. The accumulator 2000, or a similar circuit, for example implements the accumulator 706 or 708 of FIG. 7.

The accumulator 2000 for example receives a 4-bit input signal din<3:0> formed of bits 0, 1, 2 and 3. For example, this input signal din<3:0> corresponds to the phase increments Δphi in the case of the accumulator 706, or to the frequency samples FREQ' in the case of the accumulator 708.

The accumulator 2000 for example comprises four adders 2002, 2004, 2006 and 2008 respectively receiving, at their input A, the bits 0, 1, 2 and 3 of the signal din<3:0>. Each adder 2002, 2004, 2006 and 2008 performs an addition A+B+Ci, and provides the result to the data input of a respective D-type flip-flop 2010, 2012, 2014 and 2016. The flip-flops 2010, 2012, 2014 and 2016 are for example clocked by the modulated output signal RF_OUT. The outputs of the flip-flops 2010, 2012, 2014 and 2016 respectively provide bits 0, 1, 2 and 3 of an output signal dout<3:0> of the accumulator 2000. The output signal dout<3:0> for example corresponds to the phase values phi in the case of the accumulator 706, or to the phase values phi' in the case of the accumulator 708.

The output bit 0 of the output signal dout<3:0> is also provided to the B input of the adder 2002, the output 1 is also provided to the B input of the adder 2004, the output 2 is also provided to the B input of the adder 2006, and the output 3 is also provided to the B input of the adder 2008.

A carry output Co of the adder 2008 is provided to a carry input Ci of the adder 2006, a carry output Co of the adder 2006 is provided to a carry input Ci of the adder 2004 and a carry output Co of the adder 2004 is provided to a carry input Ci of the adder 2002.

While for ease of illustration FIG. 20 shows the case of a 4-bit accumulator, it will be apparent to those skilled in the art that the implementation could be extended to an n-bit accumulator, where n is any value from 2 to 32 or more.

While FIG. 7 illustrates an example of the generation of the phase delay value, phi by a loop comprising the accumulator 706, divider 710, subtractor 712 and register 714, more generally the phase delay values phi can be generated by any other interpolation filter, as will now be described with reference to FIG. 21. An aim of the interpolation filter is for example to increase the number of samples while the sample rate increases from input to output. The output-generated samples are for example calculated based on input samples in such a way that they are all placed on a continuous mathematical curve.

Figure 21:
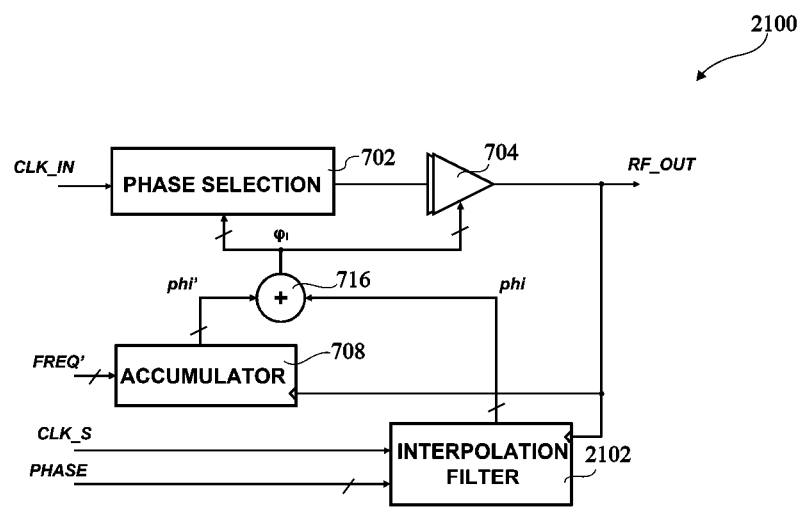
FIG. 21 schematically illustrates the polar phase and/or frequency modulator of FIG. 6 in more detail according to a further example embodiment of the present disclosure.

FIG. 21 schematically illustrates a modulator 2100 capable of performing both phase and frequency modulation. The modulator 2100 is similar to that of FIG. 7, but comprises an interpolation filter (INTERPOLATION FILTER) 2102 that replaces the accumulator 706, divider 710, subtractor 712 and register 714 of FIG. 7. This interpolation filter 2102 for example receives the phase samples PHASE, the clock signal CLK_s and the modulated output signal RF_OUT, and generates the phase delay values phi. For example, the phase delay values phi are generated at the frequency of the modulated output signal. The interpolation filter for example performs an accumulation in order to transform the input phase samples PHASE provided at an input rate into the output phase values phi provided at an output rate different to the input rate, the output rate being the frequency of the output signal RF_OUT. One possible implementation of the interpolation filter 2102 would be the loop of FIG. 7 comprising the accumulator 706, divider 710, subtractor 712 and register 714. However, it will be apparent to those skilled in the art that other implementations of such an interpolation filter would also be possible, which may or may not comprise an accumulator.

Various embodiments and variants have been described. Those skilled in the art will understand that certain features of these embodiments can be combined and other variants will readily occur to those skilled in the art. For example, while various example implementations of the normalized delay circuit 602 and normalized delay calculator 604 of FIG. 6 have been described, it will be apparent to those skilled in the art that many alternative implementations would be possible.

Furthermore, while in the example of FIG. 7 the normalized delay circuit 602 comprises a phase selection circuit 702 followed by a variable delay circuit 704, in alternative embodiments this order could be inversed, or the normalized delay circuit could comprise only one of these elements.

What is claimed is:

1. A polar phase or frequency modulator comprising:
 a normalized delay circuit configured to delay edges of an input carrier signal based on digital normalized delay control values to generate a modulated output signal; and
 a normalized delay calculator configured to receive at a first input the modulated output signal and having either:
 a second input configured to receive phase samples at a rate different to the frequency of the modulated output signal, each phase sample indicating a target phase offset of the modulated output signal with respect to the input carrier signal; or
 a third input configured to receive frequency samples at a rate different to the frequency of the modulated output signal, each frequency sample indicating a phase increment to be applied to the input carrier signal and corresponding to a target frequency of the modulated output signal; or
 the second input configured to receive the phase samples and the third input configured to receive the frequency samples,
 the normalized delay calculator being configured to generate the digital normalized delay control values based on the phase samples and/or frequency samples, and to supply to them to the normalized delay circuit, at a rate determined by the modulated output signal.

2. The polar phase or frequency modulator of claim 1, wherein the normalized delay calculator is a digital circuit.

3. The polar phase or frequency modulator of claim 1, wherein the normalized delay calculator comprises:
 a first digital circuit configured to generate first digital delay values calculated based on the phase samples received at the second input, the digital normalized delay control values being generated based on the first digital delay values; or
 a second digital circuit configured to generate second digital delay values calculated based on the frequency samples received at the third input, the digital normalized delay control values being generated based on the second digital delay values; or
 a first digital circuit configured to generate first digital delay values based on the phase samples received at the second input and a second digital circuit configured to generate second digital delay values based on the frequency samples received at the third input, the digital normalized delay control values being generated based on a sum of the first and second digital delay values.

4. The polar phase or frequency modulator of claim 3, wherein the normalized delay calculator comprises the first digital circuit, which comprises:
 a first accumulator clocked by the modulated output signal and configured to generate the first digital delay values for applying phase modulation by summing, at a rate defined by the modulated output signal, phase increments generated based on the one or more phase samples received at an input of the normalized delay calculator.

5. The polar phase or frequency modulator of claim 4, wherein the phase increments are provided at a frequency different to the frequency of the modulated output signal.

6. The polar phase or frequency modulator of claim 4, further comprising:
 a subtractor configured to determine a phase difference between each phase sample and a corresponding phase control value, wherein the phase increments are generated based on the phase differences.

7. The polar phase or frequency modulator of claim 6, wherein the normalized delay calculator further comprises:
 a divider configured to divide the phase difference by N to generate the phase increments, where N is equal to at least 2.

8. The polar phase or frequency modulator of claim 6, wherein the normalized delay calculator further comprises a register configured to store the digital normalized delay control values and to provide the digital normalized delay control values to the subtractor, wherein the register is clocked by a clock signal having a frequency equal to or less than half the frequency of the modulated output signal.

9. The polar phase or frequency modulator of claim 3, wherein the normalized delay calculator comprises the second digital circuit, which comprises:
 a second accumulator clocked by the modulated output signal and having an input for receiving the frequency samples, the second accumulator being configured to generate the second digital delay values for applying frequency modulation based on the frequency samples, the second digital delay values being generated by summing, at a rate determined by the modulated output signal, the frequency samples.

10. The polar phase or frequency modulator of claim 9, wherein the frequency samples to be modulated are each in the range:

$$FREQ'_{min} \leq FREQ' \leq FREQ'_{max}$$

where:

$$FREQ'_{min} = -2^{N_f-1}+1$$

and:

$$FREQ'_{max} = 2^{N_f-1}-1$$

and where each frequency sample is represented by a number $N_f$ of bits.

11. The polar phase or frequency modulator of claim 3, wherein the normalized delay calculator comprises the first and second digital circuits, the first digital circuit comprising:
 a first accumulator clocked by the modulated output signal and configured to generate the first digital delay values for applying phase modulation, the first delay values being generated by summing, at a rate determined by the modulated output signal, the phase increments generated based on one or more phase samples; and the second digital circuit comprising:
  a second accumulator clocked by the modulated output signal and configured to generate the second digital delay values for applying frequency modulation, the second digital delay values being generated by summing, at a rate determined by the modulated output signal, the frequency samples, wherein the phase increments represent a phase component of data symbols to be modulated, and the frequency samples represent modulation at a fixed intermediate frequency.

12. The polar phase or frequency modulator of claim 1, wherein the normalized delay calculator is configured to generate the digital normalized delay control values modulo 360°.

13. The polar phase or frequency modulator of claim 1, wherein the normalized delay circuit comprises a phase selection circuit comprising:
  a delay line generating a plurality of phase signals ($P_0$ to $P_7$) each phase-shifted by a different phase delay with respect to the input carrier signal; and
  a multiplexer configured to select one of the phase signals based on at least part of each digital normalized control value.

14. The polar phase or frequency modulator of claim 1, wherein the normalized delay circuit comprises a variable delay circuit comprising:
  a delay line configured to propagate the input carrier signal, the delay line being selectively coupled, based on at least part of each digital normalized control value, to each of a plurality of capacitances in order to vary the capacitance of the delay line.

15. A method of polar phase or frequency modulation comprising:
  receiving a modulated output signal at a first input of a normalized delay calculator, the normalized delay calculator having a second input and/or a third input;
  receiving either:
    at the second input, phase samples at a rate different to the frequency of the modulated output signal, each phase sample indicating a target phase offset of the modulated output signal with respect to the input carrier signal; or
    at the third input, frequency samples at a rate different to the frequency of the modulated output signal, each frequency sample indicating a phase increment to be applied to the input carrier signal and corresponding to a target frequency of the modulated output signal; or
    at the second input, the phase samples and at the third input, the frequency samples,
  generating, by the normalized delay calculator, digital normalized delay control values based on the phase samples and/or frequency samples, and supplying them to a normalized delay circuit, at a rate determined by the modulated output signal; and
  delaying, by the normalized delay circuit, edges of the input carrier signal based on the digital normalized delay control values to generate the modulated output signal.

* * * * *